United States Patent
Landru et al.

(10) Patent No.: US 8,623,740 B2
(45) Date of Patent: Jan. 7, 2014

(54) METHOD OF DETACHING SEMI-CONDUCTOR LAYERS AT LOW TEMPERATURE

(75) Inventors: Didier Landru, Champ Pres Froges (FR); Ionut Radu, Crolles (FR); Sébastien Vincent, Grenoble (FR)

(73) Assignee: Soitec, Bernin (FR)

( * ) Notice: Subject to any disclaimer, the term of this patent is extended or adjusted under 35 U.S.C. 154(b) by 103 days.

(21) Appl. No.: 13/126,655

(22) PCT Filed: Oct. 29, 2009

(86) PCT No.: PCT/EP2009/064308
§ 371 (c)(1),
(2), (4) Date: Apr. 28, 2011

(87) PCT Pub. No.: WO2010/049497
PCT Pub. Date: May 6, 2010

(65) Prior Publication Data
US 2011/0207295 A1    Aug. 25, 2011

(30) Foreign Application Priority Data
Oct. 30, 2008 (FR) ........................ 08 57411

(51) Int. Cl.
*H01L 21/762* (2006.01)

(52) U.S. Cl.
USPC ............. 438/406; 438/459; 257/E21.568

(58) Field of Classification Search
USPC ............ 438/406, 455, 459; 257/E21.568
See application file for complete search history.

(56) References Cited

U.S. PATENT DOCUMENTS

| | | | |
|---|---|---|---|
| 4,771,016 A | 9/1988 | Bajor et al. | 437/180 |
| 7,091,107 B2 | 8/2006 | Yokokawa et al. | 438/455 |
| 7,670,929 B2 | 3/2010 | Bourdelle et al. | 438/455 |
| 2002/0022344 A1 | 2/2002 | Kang et al. | 438/459 |
| 2004/0106303 A1 | 6/2004 | Neyret et al. | 438/799 |
| 2004/0248380 A1 | 12/2004 | Aulnette et al. | |
| 2005/0118789 A1 | 6/2005 | Aga et al. | 438/459 |
| 2005/0148163 A1 | 7/2005 | Nguyen et al. | |
| 2005/0153524 A1* | 7/2005 | Maa et al. | 438/458 |
| 2007/0170503 A1 | 7/2007 | Allibert et al. | 257/347 |
| 2007/0264797 A1 | 11/2007 | Murakami et al. | 438/458 |
| 2008/0014718 A1 | 1/2008 | Neyret et al. | 438/459 |

(Continued)

FOREIGN PATENT DOCUMENTS

| | | |
|---|---|---|
| CN | 1802737 A | 7/2006 |
| EP | 1 811 561 A1 | 7/2007 |

(Continued)

OTHER PUBLICATIONS

International Search Report, PCT/EP2009/064308, mailed Feb. 2, 2010.

(Continued)

*Primary Examiner* — Zandra Smith
*Assistant Examiner* — Toniae Thomas
(74) *Attorney, Agent, or Firm* — Winston & Strawn LLP

(57) ABSTRACT

A method for producing a structure having an ultra thin buried oxide (UTBOX) layer by assembling a donor substrate with a receiver substrate wherein at least one of the substrates includes an insulating layer having a thickness of less than 50 nm that faces the other substrate, conducting a first heat treatment for reinforcing the assembly between the two substrates at temperature below 400° C., and conducting a second heat treatment at temperature above 900° C., wherein the exposure time between 400° C. and 900° C. between the heat treatments is less than 1 minute and advantageously less than 30 seconds.

20 Claims, 4 Drawing Sheets

(56) References Cited

U.S. PATENT DOCUMENTS

| | | | |
|---|---|---|---|
| 2008/0050887 A1* | 2/2008 | Chen et al. | 438/455 |
| 2009/0032911 A1 | 2/2009 | Kononchuk | 257/647 |
| 2010/0176453 A1* | 7/2010 | Dennard et al. | 257/368 |
| 2010/0176495 A1* | 7/2010 | Chu et al. | 257/635 |
| 2011/0114918 A1* | 5/2011 | Lin et al. | 257/24 |

FOREIGN PATENT DOCUMENTS

| | | | |
|---|---|---|---|
| EP | 1 863 083 A2 | 12/2007 | |
| EP | 1 879 225 A1 | 1/2008 | |
| EP | 1 970 942 A1 | 9/2008 | |
| FR | 2 845 202 | 4/2004 | |
| FR | 2855908 A1 | 12/2004 | |
| FR | 2 903 808 A1 | 1/2008 | |
| WO | WO 2007/071787 A1 | 6/2007 | |
| WO | WO 2008/114099 A1 | 9/2008 | |

OTHER PUBLICATIONS

Kononchuk, Oleg et al., "Internal Dissolution of Buried Oxide in SOI Wafers", Solid State Phenomena, vols. 131-133, pp. 113-118 (2008).

* cited by examiner

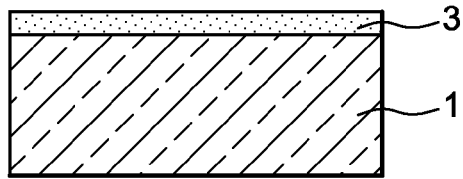 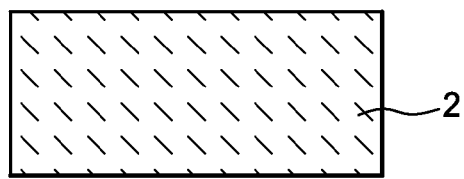
FIG. 1A  FIG. 1B
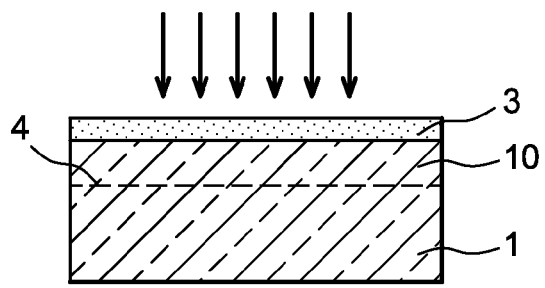
FIG. 1C
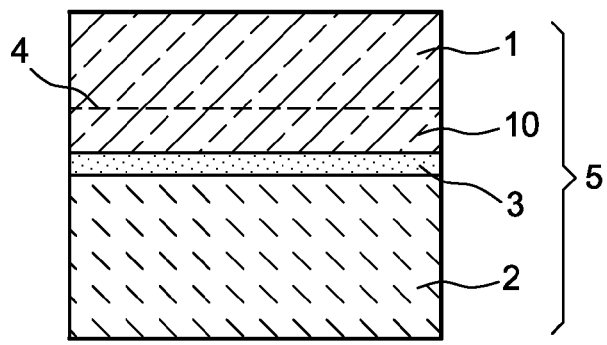
FIG. 1D

METHOD OF DETACHING SEMI-CONDUCTOR LAYERS AT LOW TEMPERATURE

This application is a 371 filing of International Patent Application PCT/EP2009/064308 filed Oct. 29, 2009.

TECHNICAL FIELD AND PRIOR ART

The invention relates to the production of Semi-Conductor on Insulator (SeOI) substrates, more specifically UTBOX (Ultra Thin Buried Oxide) type substrates.

Such SeOI structures may be obtained after transfer of a semi-conductor layer from a donor substrate to a receiver substrate. The transfer may in particular be obtained by a Smart Cut™ type method or instead by bonding techniques followed by thinning.

The Smart Cut method comprises, among others, the assembly by molecular bonding of a donor substrate with a receiver substrate, the donor substrate comprising a weakened zone in its thickness, an insulating layer being present at the surface of one of the two substrates (or both) before their being placed in contact. The weakened zone is formed by introduction of atomic and/or ionic species within the donor substrate.

For a more detailed description of this type of implantation method, reference may be made to the work "Silicon on insulator technology: materials to VLSI", second edition, Jean-Pierre COLINGE.

In general, the molecular bonding between the two substrates or their surfaces may be obtained after a preparation of the surfaces giving them either a hydrophilic or hydrophobic character.

The use of heat treatments to transfer a semi-conductor layer to the receiver substrate or further reinforce the direct bonding may lead to, for a certain number of bonded structures, the appearance of defects at the bonding interface, or even at the surface of the transferred layer. These defects are due to the degassing of by-products from the molecular bonding reaction: for example molecules of water, hydrogen or hydrocarbons.

For a certain number of bonded structures, it is known that these defects may be resorbed by heat treatments carried out at very high temperatures. These temperatures are for example between 900° C. and 1300° C. and depend on the preparation of the surfaces before bonding. Unfortunately, for other bonded structures, this solution cannot be envisaged. The limitation of the thickness of oxide on the surface of the substrates to be assembled or the presence of different materials, or instead the presence of component in one of the assembled substrates, facilitates the appearance of defects at the bonding interface, which cannot be resorbed later. This is also the case of structures bonded with the Smart Cut layer transfer method, in which a film is generally transferred onto a support substrate by detaching, at relatively low temperature (around 500° to 600° C.), a part of a donor substrate at a weakened zone.

In the case of semi-conductor layers (of thickness less than ten or so μm or several tens of nm), heat treatments, at temperatures below 1000° C., for example between 600° C. and 800° C., lead to the formation of bonding defects in the form of blisters or film free zones. These defects cannot be eliminated by heat treatments at higher temperature. For example, the bursting of the blisters is favoured by the thinness of the layers. These defects render the structures produced unusable. At present, this phenomenon limits the production of structures of thin (thickness less than 50 nm) or even ultra-thin (structures known as UTBOX) oxide films, buried at the bonding interface. The same problem is posed for Si layers directly bonded onto Si wafers, thereby forming DSB (Direct Silicon Bonding) type structures.

A method for producing such UTBOX structures is known from document US2005/00118789. The method consists in forming on at least the surface of one of the two substrates a relatively thick oxide layer, implanting a substrate known as a "donor" substrate in order to create therein a weakened zone, bonding the two substrates, detaching a semi-conductor layer from the donor substrate to the second substrate known as "receiver" substrate and applying a heat treatment. The final heat treatment is applied in order to reduce the thickness of the buried oxide layer and thereby obtain a UTBOX type structure.

However, the final heat treatment for reducing the oxide thickness as described in document US2005/00118789 requires the application of high temperatures (of around 1200° C.) for several hours, and thus necessitates specific and costly equipment.

SUMMARY OF THE INVENTION

The aim of the invention is to overcome the above mentioned drawbacks of the prior art and, more specifically, to find a method for producing:
- a UTBOX type structure, comprising an insulating layer of thickness for example less than 25 nm or 50 nm,
- or a DSB type structure, which comprises a layer of material transferred from a donor substrate to a receiver substrate, in which there is no insulating layer between the two assembled substrates.

To this end, the invention relates to a method for producing UTBOX or DSB type structures comprising:
a) the assembly of a substrate, known as "donor" substrate, with a substrate, known as "receiver" substrate,
b) a first heat treatment for reinforcing the assembly between the two substrates, at temperature below 400° C., carried out during the assembly and/or after assembly, to reinforce said assembly,
c) a second heat treatment at temperature above 900° C., the exposure time between 400° C. and 900° C. being less than 5 minutes or 1 minute or 30 seconds.

The application of the second heat treatment may comprise the application of a temperature increase ramp, the average rate of which between 400° C. and 900° C. is greater than 10° C./s.

Such a method may comprise a thinning of the donor substrate, so as to only leave on the receiver substrate a thin film of material of the donor substrate, the second heat treatment being carried out after thinning.

This may be carried out by mechanical, or mechanical-chemical method, applied to the donor substrate.

It may also be carried out by fracture of the donor substrate, for example by a heat treatment at a temperature below 400° C. The assembly may be preceded by a heat treatment step for pre-weakening the donor substrate.

The first heat treatment for reinforcing the assembly and the fracture heat treatment may be combined in a same heat treatment step.

The fracture heat treatment may be applied for a time between 30 minutes and 15 h and/or less than 5 h or between 1 h and 3 h.

Preferably, the temperature is immediately lowered after the detachment of the layer from the donor substrate onto the receiver substrate, in order to limit the heat budget or thermal budget applied to the final structure.

The fracture may be carried out by means of a weakened zone formed in the donor substrate, for example of the type created by implantation of atomic and/or ionic species or by co-implantation of atomic and/or ionic species. The implantation may be a hydrogen/helium co-implantation.

The doses of hydrogen and helium may be between $0.5 \times 10^{16}$ at/cm$^2$ and $2 \times 10^{16}$ at/cm$^2$.

The total implantation dose may be less than or equal to $6 \times 10^{16}$ at/cm$^2$, or between $10^{16}$ at/cm$^2$ and $4 \times 10^{16}$ at/cm$^2$.

Only one of the two substrates (for example the donor substrate) or both substrates may comprise an insulating layer of thickness less than 50 nm, for example a layer of silicon oxide (SiO$_2$), and/or silicon nitride (Si$_3$N$_4$), and/or silicon oxynitride (Si$_x$O$_y$N$_z$).

The thickness of the insulating layer between the two substrates may be less than 15 nm, for example if the fracture of the donor substrate, to obtain the thinning, is carried out at a temperature below 400° C. This thickness may be less than 5 nm, for example if the fracture of the donor substrate is carried out by a heat treatment at a temperature below 250° C.

In an alternative, the thin film, which results from the thinning, is in direct contact with the receiver substrate: there is then no insulating layer on one and/or the other of the surfaces to be assembled. A DSB type structure is then formed, by direct contact of the material of one of the two substrates with the material of the other substrate.

The donor substrate may be formed from a material chosen among silicon, silicon with surface crystalline orientation (1, 0, 0) or (1, 1, 0) or (1, 1, 1), silicon carbide, germanium and gallium arsenide.

The receiver substrate may for its part be formed from a material chosen among silicon, quartz, glass.

BRIEF DESCRIPTION OF DRAWINGS

Other characteristics and advantages will become apparent from the description that will now be made, while referring to the appended drawings, which represent, by way of indication and in no way limiting, several possible embodiments and in which:

FIGS. 1A to 1E are diagrams representing the successive steps of a first embodiment of a method according to the invention.

Identical, similar or equivalent parts of the different figures described hereafter bear the same numerical references so as to make it easier to go from one figure to the next.

In order to make the figures easier to read, the different parts represented in the figures are not necessarily to the same scale.

DESCRIPTION OF SPECIFIC EMBODIMENTS

A first non limiting embodiment complying with the invention will be described below.

Figure 1E:
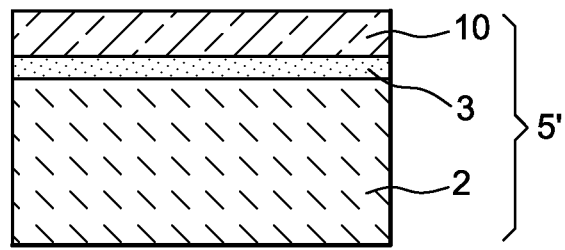

In FIG. 1A is represented a substrate 1, known as "donor" substrate, from which derives the semi-conductor layer of the final structure 5'. The donor substrate 1 comprises on its surface an insulating layer 3. The insulating layer is constituted of a silicon oxide (SiO$_2$), and/or a silicon nitride (Si$_3$N$_4$), and/or a silicon oxynitride (Si$_x$O$_y$N$_z$). The thickness of this insulating layer is less than 20 nm or 25 nm or 50 nm, more specifically between 5 and 15 nm.

Generally speaking, the donor substrate 1 may be formed from a material chosen among silicon, silicon with surface crystalline orientation (1, 0, 0), or (1, 1, 0), or (1, 1, 1), silicon carbide, germanium and gallium arsenide. The receiver substrate 2 may be formed from a material chosen among silicon, quartz, glass. Either may have electronic components.

The insulating layer 3 is described in the present case at the surface of the donor substrate 1, but may very well be formed at the surface of the receiver substrate 2 or instead on the surfaces of both substrates, so that the total thickness formed by one or the sum of the two insulating layers has a thickness less than 25 or 50 nm.

A step of forming a weakened zone 4 is then carried out, thereby delimiting the semi-conductor layer 10 to be transferred onto the substrate 2 known as "receiver", as shown in FIG. 1C. This semi-conductor layer 10 may have a thickness less than 1 μm or 100 nm or 50 nm.

The weakened zone 4 is for example obtained following a step of implantation of atomic and/or ionic species or instead by co-implantation of at least two atomic and/or ionic species, chosen for example among hydrogen, helium, at an energy chosen as a function of the thickness to be transferred of the semi-conductor layer 10 between 10 and 150 keV and a total implantation dose less than or equal to $6 \times 10^{16}$ at/cm$^2$, more particularly between 1 and $4 \times 10^{16}$ at/cm$^2$.

According to the invention, the temperature applied to obtain the fracture is limited to a threshold temperature below 400° C. This heat treatment step may if necessary be completed by an input of additional energy, for example mechanical, in order to facilitate the fracture. It has been observed that this relatively low temperature is beneficial to the quality of the bonding of the layer transferred onto the receiver substrate. In a preferred manner, the co-implantation with hydrogen and helium is carried out in normal dose ranges around $0.5 \times 10^{16}$ to $2 \times 10^{16}$ H$^+$/cm$^2$ and $0.5 \times 10^{16}$ to $2 \times 10^{16}$ He$^+$/cm$^2$. These implantation conditions may be adapted in order to be able to carry out in the silicon, at a later stage, a detachment, without exposing the structure to a temperature above 400° C. Thus, it is possible, if necessary, to increase the doses of implanted species to satisfy this condition.

In an optional manner, a surface preparation step is carried out on the donor substrate 1 and/or on the receiver substrate 2 for the purpose of their assembly. This step will be described hereafter.

Also in an optional manner, the donor substrate may undergo a pre-weakening heat treatment before being placed in contact with the receiver substrate. Thus, the temperature applied to obtain the fracture may again be reduced, which is an advantage for the lowest thicknesses of buried insulator. For example, a pre-weakening heat treatment at 250° C. for a time from 10 minutes to 10 hours, may make it possible to limit the temperature necessary to obtain the fracture to 250° C., which is particularly worthwhile for buried insulator thicknesses of around 5 nm or less.

Finally, the two substrates are placed in contact with each other, so as to carry out a bonding by molecular adhesion and thereby form the structure 5 as represented in FIG. 1D. Insulating layer 3 is between the two substrates 1 and 2.

Before carrying out the fracture, a bonding assistance or bonding reinforcement heat treatment may be carried out, at a temperature below 400° C.

In this way, the two assembled substrates are never exposed to high temperatures (above around 400° C.).

Once the assembly has been carried out, the structure 5 is subjected, according to the invention, to a heat treatment, if necessary completed by an input of mechanical energy, for the purpose of detaching the semi-conductor layer 10 from the donor substrate 1. The detachment heat treatment of the present invention is applied at a maximum temperature below 400° C., for example between 250° C. and 400° C., and preferentially between 280° C. and 350° C. The bonding assistance heat treatment and the fracture heat treatment may be combined in a same heat treatment step.

Advantageously, the detachment comprises at least one plateau of maintaining the temperature at a temperature less than or equal to the maximum detachment temperature. Thus, the detachment as such may take place either at a plateau or instead during a temperature increase ramp, without nevertheless exceeding the maximum temperature of 400° C.

The time of the application of the maximum temperature is between 30 minutes and 15 h, preferentially for a time less than 5 h, or instead more specifically for a time between 1 h and 3 h.

Finally, once the detachment of the semi-conductor layer 10 onto the receiver substrate 2 has been carried out, in a preferred manner, the temperature is immediately lowered in order to limit the heat budget applied to the final structure 5'.

With a detachment obtained at low temperature, it is thereby possible to limit the production but also the diffusion of gases or impurities that could be found at the bonding interface and thus, with these optimal conditions, of transferring a semi-conductor layer 10 without the least macroscopic bonding defect, or at least with a reduced defectivity. The final structure 5' thus has a very high quality despite the low thickness of the insulating layer 3.

With the chosen heat treatment conditions, for which the treatment temperature remains below 400° C., whether during the assembly or during a fracture of a weakened zone, no formation of molecular hydrogen that would lead to the creation of bonding defects (bubbles, blisters) is initiated.

Indeed, it seems that the origin of the creation of defects at the bonding stems from the reaction:

$$2H_2O + Si \rightarrow SiO_2 + H_2 \quad (1).$$

The first part of (1) expresses the chemical reaction that takes place at the interface: a thin film of water (thickness around several atomic layers), trapped between the two assembled substrates 1, 2, reacts with the Si constituting one at least of the substrates (for example if it is directly exposed to these molecules of water as in the case of an oxide/silicon bonding, or instead after diffusion of water through a layer of oxide in the case of an oxide/oxide bonding).

This oxidation reaction (second part of (1)) releases hydrogen, which is trapped in turn at the bonding interface. In the case of thick oxide, this hydrogen may be trapped in this layer. This is not possible in the case of thin oxide, as in the present invention, and consequently the excess of hydrogen is probably the reason for "bubble" or "blister" type bonding defects.

In other words, according to one interpretation, the molecules of $H_2$ are mainly formed at temperatures above 400° C. and the gaseous residues (hydrogen, etc.) from the reaction, which takes place during the bonding, remain trapped in the form of Si—H bonds.

According to the invention, a complementary rapid treatment is applied after fracture, detachment of the semi-conductor layer 10 from the donor substrate 1 and removal of the remainder of this donor substrate. Rapid treatment is taken to mean a treatment taking the structure to a temperature above 900° C. in a very short time for attaining this temperature, of 1 s, or several seconds to several minutes, for example 3 minutes or 5 minutes. According to the invention, the exposure time of the assembly is limited to within the temperature range 400°-900° C. It is in fact in this temperature range that the defects linked to the presence of bonding residues present at the bonding interface develop. Above 900° C., these residues (H, $H_2$, etc.) diffuse very quickly without being able to form these defects, particularly of blister type.

For example, a very rapid temperature increase ramp is carried out, from an initial temperature equal or close to room temperature to a treatment temperature greater than or equal to 900° C. A ramp applied in this case may attain a rate above 10° C./s or even 50° C./s. This may be obtained in ovens known as RTA (Rapid Thermal Annealer), as disclosed in FR2845202, or instead in an epitaxy frame, for example an Epsilon™ type model of the ASM Company or instead a Centura™ model of the Applied Materials Company. Such a ramp may also be obtained with a "Spike Fast RTP" type oven, which can attain ramps of 200° C./s to 300° C./s.

Such a heat treatment may be applied for a time from several seconds to several minutes, in a neutral (Ar, N) or oxidising, reducing ($H_2$) or etching ($H_2$+HCl for example) atmosphere.

Such a rapid annealing and at high temperature has the principal effect of contributing to stabilising the bonding interface. Being particularly rapid, it does not allow the molecules or atoms of gas or impurities that are found at the bonding interface to develop and to create defects at said interface (in particular, the reinforcement of the bonding interface takes place before the creation of $H_2$ molecules has the time to occur or to have an adverse effect on the bonding).

Finally, a standard finishing enables the requisite structure to be obtained.

According to an alternative, represented in FIGS. 2A-2D, a thinning is not carried out by fracture of the donor substrate along a weakened zone, but by a chemical and/or mechanical method that may be carried out at room temperature. It is thus not necessary to carry out an implantation in the donor substrate.

Figure 2A:
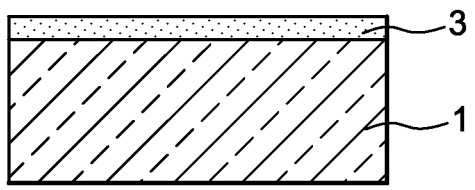
FIGS. 2A to 2D are diagrams representing the successive steps of a second embodiment of a method according to the invention.
Figure 2B:
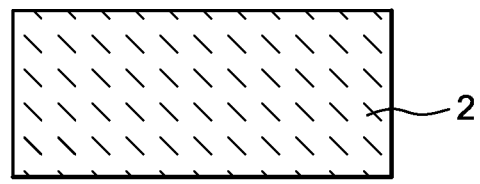
Figure 2C:
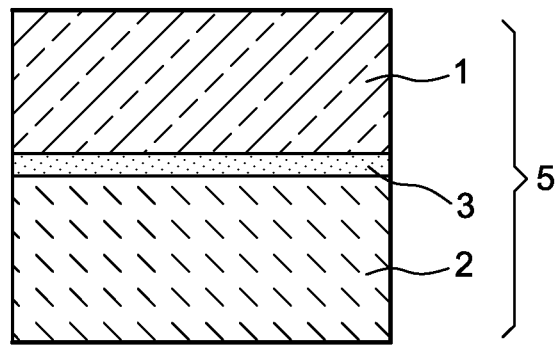

Beginning with substrates 1, 2 of FIGS. 2A and 2B, identical to those of FIGS. 1A and 1B, an assembly is carried out to obtain a structure such as the structure 5 as already explained above (FIG. 2C). The indications given above for the substrates 1, 2 remain valid here. Again insulating layer 3 is between the two substrates 1 and 2.

In an optional manner, a surface preparation step is carried out on the donor substrate 1 and/or on the receiver substrate 2 for the purpose of their assembly. Such a treatment is described below.

A bonding assistance or bonding reinforcement heat treatment may be carried out, at a temperature below 400° C.

Once again, the two substrates assembled are never exposed to high temperatures (above around 400° C.).

Figure 2D:
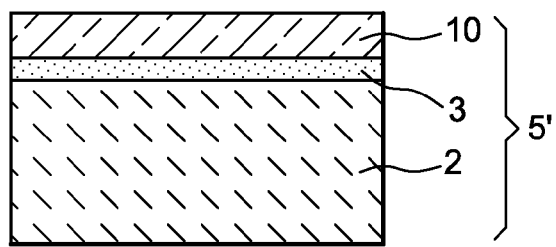

Finally, a thinning of the donor substrate 1 is carried out, for example by mechanical-chemical polishing, grinding and/or chemical etching (TMAH or KOH in the case of silicon etching). The structure of FIG. 2D is thus obtained, with a layer 10 of material, derived from the donor substrate, which may have a thickness of several tens of microns, for example 20 microns, or less.

As in the first embodiment, a rapid complementary treatment is applied after thinning of the donor substrate 2 with the same effect as above (stabilisation of the bonding interface, by particularly rapid method that does not allow the molecules or atoms of gas or impurities that are found at the bonding interface to develop and create defects at said interface). Rapid treatment is taken to mean a treatment taking the structure to a temperature above 900° C. in a very short time, of 1 s, or several seconds, to several minutes, for example 3 minutes or 5 minutes. For example, a very rapid temperature increase ramp is carried out, as has already been explained above.

Finally, a standard finishing enables, if necessary, the requisite structure to be obtained. In this second embodiment, the second heat treatment may be applied to the assembly before the thinning step.

Whatever the embodiment envisaged, a preparation treatment of the two substrates before assembly comprises for example a treatment intended to render their surface hydrophilic and/or to clean the surfaces of the substrates before assembling them.

For example, a hydrophilic character surface preparation is carried out on the donor substrate 1 comprising the insulating layer 3, but also on the receiver substrate 2.

The hydrophilic preparation of the surface comprises a Sulpho-Peroxide Mixture (SPM) and/or Ammonium Peroxide Mixture (APM) type chemical treatment and/or a treatment enabling for example a cleaning, such as a degassing heat treatment (of water and/or hydrocarbons), or instead an "RCA" type treatment, in order to eliminate the contaminating particles.

As a reminder, the treatment by means of a chemical bath called "RCA" consists in treating said faces successively with:
 a first bath of a solution known by the acronym "SC1", (Standard Clean 1), and which comprises a mixture of ammonium hydroxide ($NH_4OH$), hydrogen peroxide ($H_2O_2$) and deionised water,
 a second bath of a solution known by the acronym "SC2", (Standard Clean 2), and which comprises a mixture of hydrochloric acid (HCl), hydrogen peroxide ($H_2O_2$) and deionised water.

The substrates are then brushed and/or rinsed (with deionised water for example) or even dried.

In an optional manner, one or the other or both surfaces to be assembled may be subjected to a plasma activation treatment, under an inert atmosphere, for example containing argon or nitrogen, or under an atmosphere containing oxygen. This activation, if it takes place, is carried out preferably after a cleaning.

The techniques described above according to the invention may be further improved to obtain a very thin insulating layer, of thickness for example less than 10 nm or 5 nm, of very good quality, or for example an SOI with a layer of oxide of the indicated thickness.

To this end, a structure is produced according to a method according to the invention, the insulator being an oxide layer, for example of thickness less than 10 nm or between 15 nm and 20 nm.

The partial dissolution of this oxide is then carried out to bring its thickness to the final requisite thickness, less than 10 nm.

A dissolution technique is known from the document of O. Kononchuk et al. "Internal dissolution of Buried Oxide in SOI wafers", Solid State Phenomena, Vol. 131-133, p. 113-118, 2008 or US2005/00118789.

For example, the structure is treated in a neutral atmosphere, comprising for example argon, and/or a hydrogen reducing atmosphere, with a very low oxygen concentration (<1 ppm), and at a temperature substantially between 1100° C. and 1200° C., and for a duration of between some minutes (for example 2 min or 5 min or 10 min or 20 min or 30 min) and some hours (for example 1 h or 2 h or 5 h or 10 h) for example. During this heat treatment, the oxygen present in the layer of buried oxide is dissolved in the treatment atmosphere through the thin film of semi-conductor material. This is for example made of silicon, the oxide layer $SiO_2$ dissolved then transforms into Si of good quality.

In the case of an SOI with a buried oxide of 20 nm, obtained according to one of the techniques according to the present invention, it is possible to obtain a thinning of the oxide to a final thickness chosen for example at 5 nm.

Advantageously, this heat treatment under neutral atmosphere and at very low oxygen concentration is continued at least until the whole thickness of the layer of oxide formed on the side of the donor substrate is dissolved.

Another embodiment of the present invention will now be described with reference to FIGS. 3A to 3D. The same elements bear the same numerical references as for the preceding embodiments and will not be re-described.

Neither the donor substrate 1 (FIG. 3A) nor the receiver substrate 2 (FIG. 3B) comprise a surface insulating layer. Indeed, it is sought in the end to form a structure known as a DSB structure. Moreover, no implantation is carried out.

A surface preparation of one and/or the other of these two substrates makes it possible to confer a hydrophobic type character to the treated surface, for example according to an "HF last" technique consisting in a cleaning sequence, the final step of which is a cleaning by means of a solution containing HF diluted in water. This well known cleaning enables the surface to be rendered hydrophobic. The technique taught in patent application FR0606311 may also be used.

For example, the hydrophobic surface preparation comprises a surface deoxidising treatment; in the case of a silicon surface, it may be a liquid HF type chemical attack.

Figure 3A:
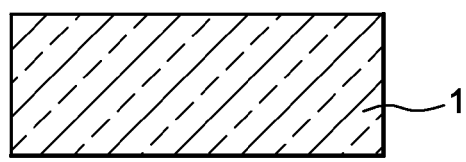
FIGS. 3A to 3D are diagrams representing the successive steps of a third embodiment of a method according to the invention.
Figure 3B:
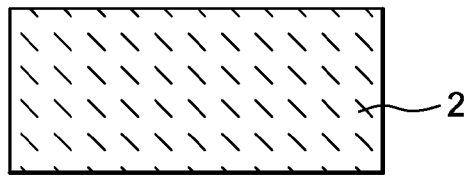
Figure 3C:
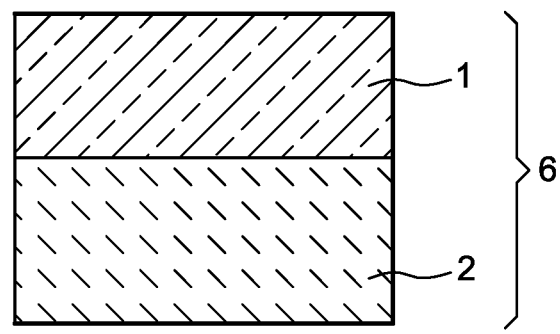

Once the surfaces of the donor 1 and receiver 2 substrates have been cleaned then activated, the substrates are assembled (FIG. 3C) so that the semi-conductor layer 10 is in direct contact with the receiver substrate 2, in other words without the intermediary of the least bonding layer, forming the structure 6 as illustrated in FIG. 3C.

Finally, the heat treatment according to the invention is applied to the assembled structure 6 in order to reinforce the bonding between the two substrates placed in contact. According to this heat treatment, a temperature between 250° C. and 400° C. is applied for a time between 30 minutes and 15 h, preferentially for a time less than 5 h.

A mechanical thinning by grinding of the donor substrate 1 (FIG. 3D) is then carried out. A semi-conductor layer 10 of around 20 µm thickness may thereby be created.

Figure 3D:
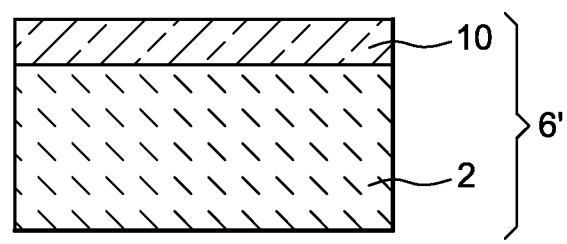

The optimal heat treatment conditions enable the transfer of a semi-conductor layer 10 of very good quality, with a low or even zero number of defects, directly on the receiver substrate 2, and thus enable a final DSB structure 6' of very high quality to be obtained, despite the absence of bonding layer, as illustrated in FIG. 3D.

As for the quality of the interface obtained in the case of a DSB structure, the same effects occur as in the case of the other embodiments described above, with the presence of an insulating layer.

As in the first embodiment, a rapid complementary treatment is applied after thinning the donor substrate 2 with the same effect as above (stabilisation of the bonding interface, by particularly rapid method that does not allow the molecules or atoms of gas or impurities that are found at the bonding interface to develop and to create defects at this level). Rapid treatment is taken to mean a treatment taking the structure to a temperature above 900° C. in a very short time, of 1 s, or several seconds, to several minutes, for example 3 minutes or 5 minutes. For example, a very rapid temperature increase ramp is carried out, as already explained above.

In the case of FIG. 3D, the thinned structure may undergo an annealing under hydrogen, in an epitaxy frame at a temperature of 1100° C. for around 1 minute in order to reinforce the bonding interface.

EXAMPLE 1

This example relates to a method as described above in FIGS. 1A-1E.

A donor substrate 1 made of silicon (1, 0, 0) is thermally oxidised on the surface so as to form a layer 3 of silicon oxide ($SiO_2$) of 8 mm thickness.

A step of co-implantation of helium and hydrogen at respective doses of $1\times10^{16}$ He$^+$/cm$^2$ and $0.9\times10^{16}$ H$^+$/cm$^2$, at respective energies of 40 and 25 keV, is then carried out in order to create a weakened zone 4 within the donor substrate 1, thereby delimiting a semi-conductor layer 10 of 270 nm thickness.

An RCA type cleaning of the wafers is then applied for the purpose of the assembly of the substrate 1 with a receiver substrate 2 made of silicon (1, 0, 0). During the assembly, a heating around 120° C. is applied to the totality of the surfaces of the substrates.

The treatment according to the invention is then carried out by applying a temperature of 300° C. for 2 h, to the assembled structure 5, making it possible to detach the semi-conductor layer 10 from the donor substrate 1 and to transfer it onto the receiver substrate 2 while limiting the number of interface defects, and thus enabling a transfer of semi-conductor layer of high quality.

Finally, the final UTBOX type structure 5' is subjected to a treatment to reinforce the bonding interface. In this specific case, the final structure is subjected to a temperature of 1200° C. for 30 seconds, in an RTA oven, the increase in temperature attaining around 50°/s, and thus the exposure time at a temperature between 400° C. and 900° C. is around 10 s. Finally, the structure 5' is subjected to a finishing treatment comprising sacrificial oxidations and another RTA (Rapid Thermal Anneal) type treatment.

It is observed that the defectivity after detachment is reduced compared to known techniques.

EXAMPLE 2

This example relates to a method as described above in FIGS. 1A-1E.

A donor substrate 1 made of silicon (1, 0, 0) is thermally oxidised at the surface in order to form a layer 3 of silicon oxide ($SiO_2$) of 8 nm thickness.

A step of co-implantation of helium and hydrogen at respective doses of $1\times10^{16}$ He$^+$/cm$^2$ and $0.9\times10^{16}$ H$^{+/cm2}$, at respective energies of 40 and 25 keV, is then carried out in order to create a weakened zone 4 within the donor substrate 1, thereby delimiting a semi-conductor layer 10 of 270 nm.

An RCA type cleaning of the wafers is then applied for the purpose of the assembly of the substrate with a receiver substrate 2 made of oxidised silicon (1, 0, 0) and having initially an oxide thickness of around 3 nm. The sum of the oxide thicknesses is around 11 nm, around 1 nm of which may be etched during the cleaning steps before bonding, a thickness of insulator in the final structure around 10 nm.

A treatment according to the invention is carried out, by applying a temperature of 300° C. for 2 h, to the assembled structure 5 (FIG. 1D), enabling the semi-conductor layer 10 to be detached from the donor substrate 1 and to transfer it onto the receiver substrate 2 while limiting the number of interface defects, and thus enabling a transfer of semi-conductor layer of high quality.

Finally, the final UTBOX type structure 5' is subjected to a treatment to reinforce the bonding interface similar to that of example 1 (RTA 30 s, 1200° under $H_2$).

It is observed that the defectivity after detachment is reduced compared to known techniques.

What is claimed is:

1. A method for reducing defects at a bonding interface when producing a structure having an ultra thin buried oxide (UTBOX) layer, which comprises:
   assembling donor and receiver substrates at a bonding interface wherein at least one of the two substrates includes an insulating layer with the insulating layer(s) positioned between the substrates and having a total thickness of less than 50 nm;
   conducting a first heat treatment for reinforcing the assembly at a temperature below 400° C., with the first heat treatment carried out during or after the assembling;
   conducting a second heat treatment at a temperature above 900° C. after the first heat treatment; and
   controlling exposure time of the assembly at temperatures between 400° C. and 900° C. to less than 1 minute to reduce defects at the bonding interface,
   wherein the substrates are assembled by molecular bonding and the method comprises ramping the heating temperature between the first and second heat treatments at a rate of above 10° C./s.

2. The method according to claim 1, which comprises ramping the heating temperature between the first and second heat treatments at a rate of above 50° C./s.

3. The method according to claim 1, which comprises ramping the heating temperature between the first and second heat treatments at a minimum rate of 200° C./s or 300° C./s.

4. The method according to claim 1, wherein the UTBOX layer is an oxide, a nitride or an oxynitride, the donor substrate comprises a material of silicon, silicon having a surface crystalline orientation of (1, 0, 0), (1, 1, 0) or (1, 1, 1), silicon carbide, germanium or gallium arsenide, and the receiver substrate comprises a material of silicon, quartz, or glass.

5. A method for reducing defects at a bonding interface when producing a structure having an ultra thin buried oxide (UTBOX) layer, which comprises:
   assembling donor and receiver substrates at a bonding interface wherein at least one of the two substrates includes an insulating layer with the insulating layer(s) positioned between the substrates and having a total thickness of less than 50 nm;
   conducting a first heat treatment for reinforcing the assembly at a temperature below 400° C., with the first heat treatment carried out during or after the assembling;
   thinning the donor substrate after assembling, so as to leave on the receiver substrate only a thin film of the donor substrate;
   conducting a second heat treatment at a temperature above 900° C. after the first heat treatment; and
   controlling exposure time of the assembly at temperatures between 400° C. and 900° C. to less than 1 minute to reduce defects at the bonding interface;
   wherein the second heat treatment is conducted after the thinning 6. The method according to claim 5, wherein the UTBOX layer has a thickness of less than 25 nm and the thinning is carried out by a mechanical or mechanical-chemical method.

7. The method according to claim 5, which further comprises conducting a heat treatment step for pre-weakening of the donor substrate prior to the assembling.

8. The method according to claim 5, wherein the UTBOX layer has a thickness of 20 nm or less and the thinning is carried out by fracture of the donor substrate.

9. The method according to claim 5, which comprises conducting the fracture by applying a heat treatment to the donor wafer at a temperature between 280° C. and 350° C.

10. The method according to claim 9, wherein the first heat treatment for reinforcing the assembly and the fracture heat treatment are combined in a single heat treatment step.

11. The method according to claim 9, wherein the fracture heat treatment is applied for a time of between one of 30 minutes and 15 h, between 30minutes and less than 5 h, or between 1 h and 3 h.

12. The method according to claim 5, which further comprises immediately lowering the temperature of the first heat treatment after fracture of the donor substrate in order to limit the heat budget applied to the structure.

13. The method according to claim 5, wherein the thickness of UTBOX layer is less than 5 nm to 15 nm and the fracture of the donor substrate is carried out by a heat treatment at a temperature below 250° C.

14. The method according to claim 5, wherein the UTBOX layer is an oxide, a nitride or an oxynitride.

15. The method according to claim 5, wherein the UTBOX layer is silicon oxide ($SiO_2$), silicon nitride ($Si_3N_4$), or silicon oxynitride ($Si_xO_yN_z$).

16. The method according to claim 5, wherein the donor substrate comprises a material of silicon, silicon having a surface crystalline orientation of (1, 0, 0), (1, 1, 0) or (1, 1, 1), silicon carbide, germanium or gallium arsenide.

17. The method according to claim 5, wherein the receiver substrate comprises a material of silicon, quartz, or glass.

18. The method according to claim 5, wherein the UTBOX layer is an oxide, a nitride or an oxynitride, the donor substrate comprises a material of silicon, silicon having a surface crystalline orientation of (1, 0, 0), (1, 1, 0) or (1, 1, 1), silicon carbide, germanium or gallium arsenide, and the receiver substrate comprises a material of silicon, quartz, or glass.

19. A method for reducing defects at a bonding interface when producing a structure having an ultra thin buried oxide (UTBOX) layer, which comprises:
assembling donor and receiver substrates at a bonding interface wherein at least one of the two substrates includes an insulating layer with the insulating layer(s) positioned between the substrates and having a total thickness of less than 50 nm;
conducting a first heat treatment for reinforcing the assembly at a temperature below 400° C., with the first heat treatment carried out during or after the assembling;
conducting a second heat treatment at a temperature above 900° C. after the first heat treatment;
controlling exposure time of the assembly at temperatures between 400° C. and 900° C. to less than 1 minute to reduce defects at the bonding interface; and
thinning the insulating layer by treatment in an atmosphere having an oxygen concentration less than 1 ppm, and at a temperature substantially between 1100° C. and 1200° C.

20. The method according to claim 19, wherein the UTBOX layer is an oxide, a nitride or an oxynitride, the donor substrate comprises a material of silicon, silicon having a surface crystalline orientation of (1, 0, 0), (1, 1, 0) or (1, 1, 1), silicon carbide, germanium or gallium arsenide, and the receiver substrate comprises a material of silicon, quartz, or glass.

* * * * *